(12) United States Patent
Ariyoshi et al.

(10) Patent No.: US 8,247,290 B2
(45) Date of Patent: Aug. 21, 2012

(54) SEMICONDUCTOR DEVICE AND METHOD OF MANUFACTURING THEREOF

(75) Inventors: Junichi Ariyoshi, Kawasaki (JP); Toru Anezaki, Kawasaki (JP); Hiroshi Morioka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 11 days.

(21) Appl. No.: 12/163,168

(22) Filed: Jun. 27, 2008

(65) Prior Publication Data

US 2009/0001425 A1 Jan. 1, 2009

(30) Foreign Application Priority Data

Jun. 28, 2007 (JP) ................................. 2007-171151

(51) Int. Cl.
*H01L 21/336* (2006.01)

(52) U.S. Cl. ........ 438/257; 438/587; 438/598; 438/593; 257/202

(58) Field of Classification Search .................. 438/587, 438/598, 593, 257; 257/202
See application file for complete search history.

(56) References Cited

U.S. PATENT DOCUMENTS

| | | | |
|---|---|---|---|
| 5,219,775 A | 6/1993 | Saeki et al. | |
| 5,950,086 A | 9/1999 | Takahashi et al. | |
| 6,376,309 B2 * | 4/2002 | Wang et al. | 438/261 |
| 6,458,655 B1 * | 10/2002 | Yuzuriha et al. | 438/257 |
| 7,397,093 B2 * | 7/2008 | Sel et al. | 257/390 |
| 2001/0001295 A1 * | 5/2001 | Odanaka et al. | 438/259 |
| 2002/0048961 A1 | 4/2002 | Yamada | |
| 2003/0148583 A1 * | 8/2003 | Adachi et al. | 438/257 |
| 2005/0009272 A1 * | 1/2005 | Chen et al. | 438/257 |
| 2005/0142741 A1 | 6/2005 | Yang et al. | |
| 2005/0207264 A1 * | 9/2005 | Hsieh et al. | 365/232 |
| 2006/0205158 A1 | 9/2006 | Kim | |
| 2006/0214217 A1 * | 9/2006 | Watanabe et al. | 257/315 |
| 2007/0262353 A1 * | 11/2007 | Nishiyama et al. | 257/213 |
| 2008/0105927 A1 * | 5/2008 | Ahn et al. | 257/365 |

FOREIGN PATENT DOCUMENTS

| | | |
|---|---|---|
| JP | 63-186478 A | 2/1988 |
| JP | 02-010875 A | 1/1990 |
| JP | 4-263473 A | 9/1992 |
| JP | 10-163456 A | 6/1998 |
| JP | 2000-216274 A | 8/2000 |
| JP | 2005-197640 A | 7/2005 |
| JP | 2006-253626 A | 9/2006 |

OTHER PUBLICATIONS

Kim, Method for manufacturing mosfet device using thermal silicidation between tungsten and polysilicon, Jan. 5, 2007, [Derwent Account No. 2007-855609 of KR publication No. 2007002517.*

* cited by examiner

*Primary Examiner* — Julio J Maldonado
*Assistant Examiner* — Hajar Kolahdouzan
(74) *Attorney, Agent, or Firm* — Westerman, Hattori, Daniels & Adrian, LLP

(57) ABSTRACT

A method of manufacturing a semiconductor device has forming a first conductive film over a semiconductor substrate, etching the first conductive film, forming a plurality of first conductive patterns arranged in a first direction, and forming a side surface on an outside of a conductive pattern positioned at an end among the plurality of first conductive patterns such that the side surface has a first inclination angle smaller than a second inclination angle of a side surface on an inside of the conductive pattern positioned at the end, forming a first insulation film over the plurality of first conductive patterns, and forming a second conductive pattern over the first insulation film.

7 Claims, 11 Drawing Sheets

31  32  31

SEMICONDUCTOR DEVICE AND METHOD OF MANUFACTURING THEREOF

BACKGROUND

The present invention relates to a semiconductor device and method of manufacturing the semiconductor device, and more specifically, to a semiconductor memory having a floating gate.

An Electrically Erasable and Programmable Read Only Memory (EEPROM) having a floating gate and a control gate, a Metal Nitride Oxide Silicon (MNOS) memory which does not include the floating gate are conventionally known as a non-volatile semiconductor memory that holds stored information after power thereof is turned off. A flash memory is also well known as one of EEPROMs.

The control gate covers the floating gate and further extends beyond a peripheral area of a memory cell part.

A technique for reducing a resistance value of the control gate is known in which a metal silicide film is formed over the control gate. However, due to a steep slope on a side surface of the floating gate provided at an outermost end of the memory cell, a steep slope may be formed over a top surface of the control gate. If an insulation film remains at the steep slope part of the control gate, this results in a problem in that a part where the metal silicide film is not formed at the steep slope part. This leads to uneven resistance values of the control gates and thus results in deterioration in the semiconductor memory characteristics. Note that the insulation film remaining at the steep slope part of the control gate is, for example, the insulation film which is deposited such that the control gate is covered with the insulation film when a sidewall insulation film is formed over the sidewall of the control gate and which is removed by an etching back process. For the problem described above, a technique is known in which a sidewall insulation film is formed over both side surfaces of the floating gate, so that the steep slope of the top surface over the control gate can be alleviated. Moreover, another technique is also known in which a film thickness of each of the floating gates is adjusted, so that the steep slope of the control gate can be alleviated.

SUMMARY

An aspect of the invention is a method of manufacturing a semiconductor device including forming a first conductive film over a semiconductor substrate, etching the first conductive film, forming a plurality of first conductive patterns arranged in a first direction, and forming a side surface on an outside of a conductive pattern positioned at an end among the plurality of first conductive patterns such that the side surface has a first inclination angle smaller than a second inclination angle of a side surface on an inside of the conductive pattern positioned at the end, forming a first insulation film over the plurality of first conductive patterns, and forming a second conductive pattern over the first insulation film.

DETAILED DESCRIPTION OF THE INVENTION

A floating gate is formed such that an inclination angle of one side surface on a peripheral part side (hereinafter, referred to as an "outside") of a floating gate positioned at least at an end among the plurality of floating gates formed over a memory cell area is smaller than an inclination angle of a side surface on the other side (hereinafter, referred to as an "inside") of the floating gate positioned at the end.

When the floating gate is formed with etching, a distance between the plurality of adjacent floating gates in an arranged manner is short and thus the floating gates form a so-called dense pattern. On the other hand, no structural member is provided in proximity to an outside of an outermost floating gate among the plurality of the floating gates and thus the floating gates form a so-called sparse pattern. A side surface on the outside of the floating gate is formed such that the side surface is made gentler than a side surface on an inside of the outermost floating gate, by utilizing a difference between the sparse and dense patterns and devising conditions for etching a control gate, such as types of the etching gases.

In accordance with the method disclosed above, a slope of the control gate positioned over the gentle slope of the side surface on the outside of the outermost floating gate can be made gentle, in the control gate formed through a dielectric film over the plurality of floating gates. In consequence, it is possible to prevent a metal silicide film-unformed area from being formed over the control gate. Thus the method disclosed above is capable of effectively reducing deterioration in semiconductor memory characteristics due to the steep slope of the floating gate.

Figure 1A:
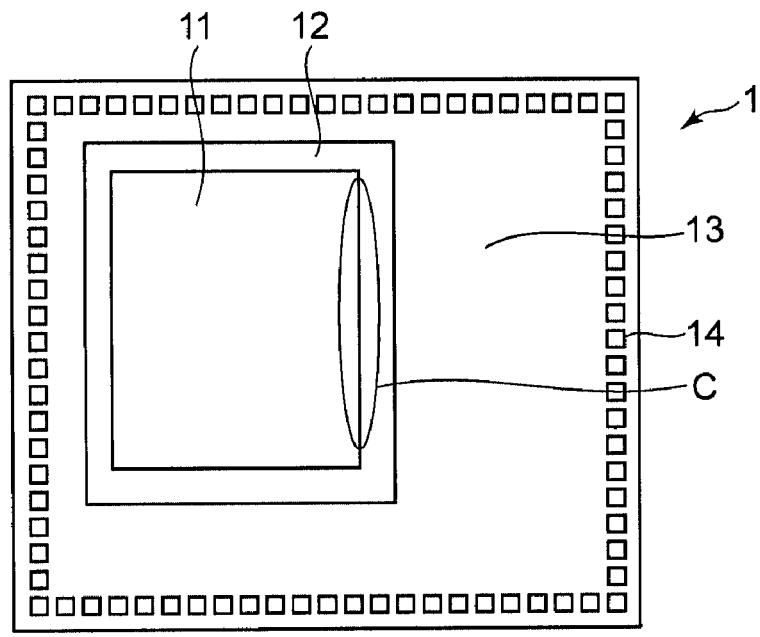
FIGS. 1A and 1B illustrate a structure of a non-volatile memory according to an embodiment.
Figure 1B:
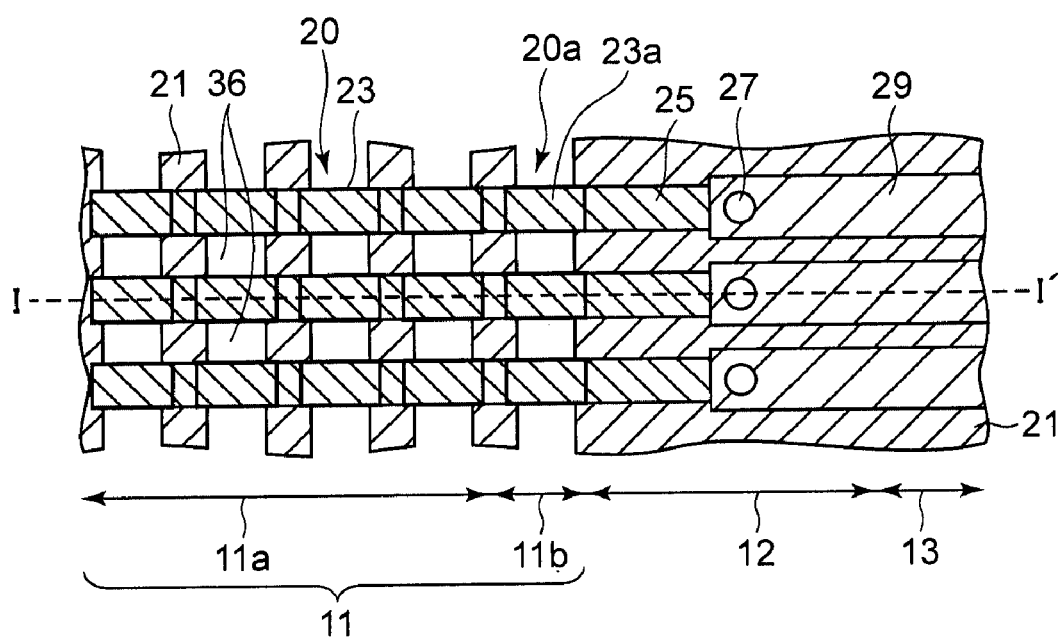
Figure 2:
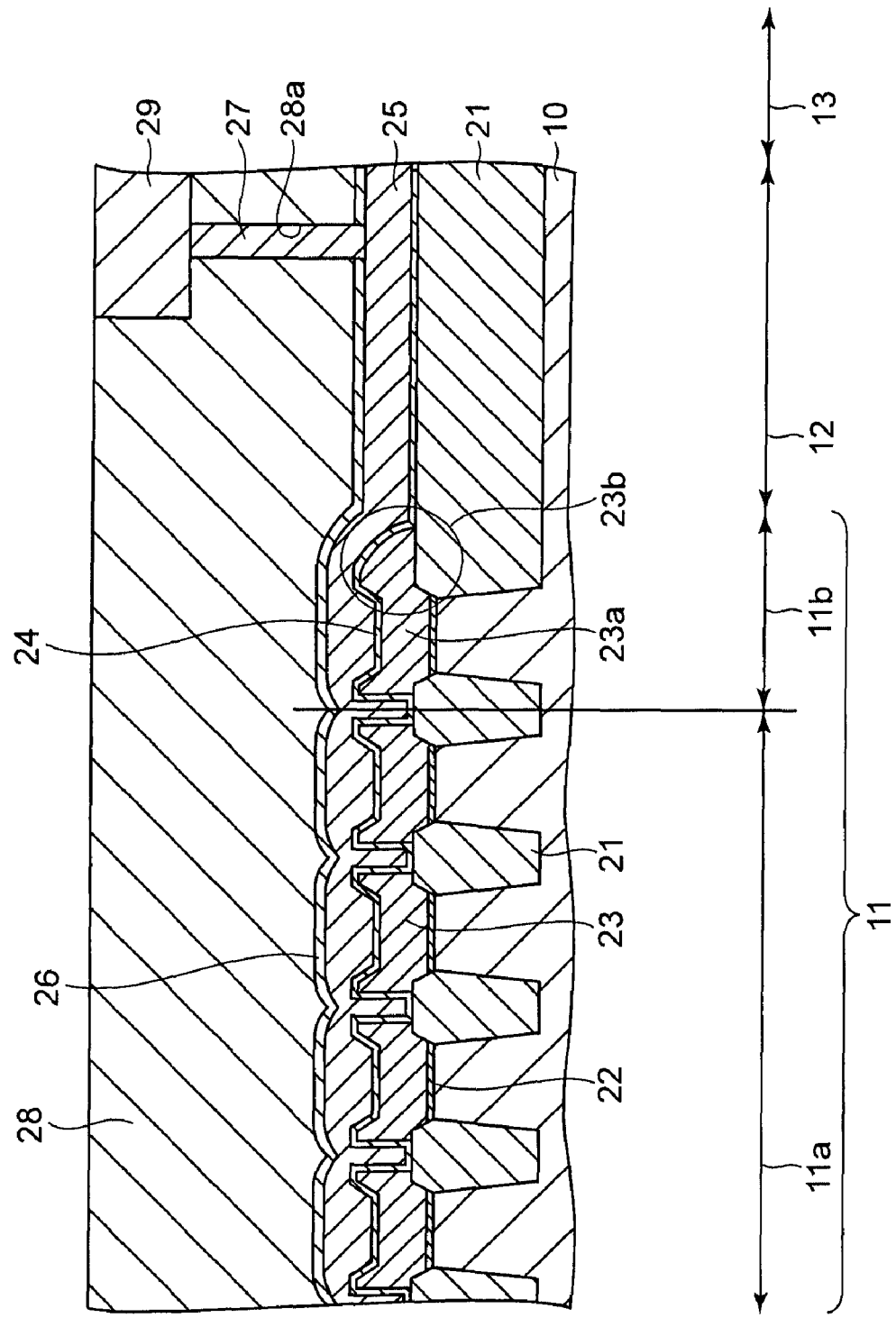
FIG. 2 is a sectional view taken on a line I-I' in FIG. 1B.

FIG. 1A is a plan view illustrating a structure of a flash memory according to an embodiment. FIG. 1B is an enlarged plan view of a part surrounded by an oval shape C in FIG. 1A. FIG. 2 is a sectional view taken on a line I-I' in FIG. 1B.

In the flash memory, as shown in FIG. 1A, a memory chip 1 includes a memory cell part 11, a peripheral part 12 which surrounds the memory cell part 11, other circuitry 13, and a plurality of pad electrodes 14 arranged at a periphery of the memory chip 1.

The other circuitry 13 includes, for example, control circuits, logic circuits and so on of the memory cell part 11.

As shown in FIG. 1B, the memory cell part 11 includes a main memory cell area 11a and a dummy cell area 11b. The dummy cell area 11b includes dummy cell 20a provided at an end of the main memory cell area 11a in a word line direction. Among the plurality of floating gates 23, the floating gate 23 particularly positioned at an end on the peripheral side of the memory cell area does not function sufficiently as a floating gate. For the above reason, such a floating gate is provided as a dummy floating gate.

In the memory cell part 11 and the peripheral part 12, as shown in FIG. 1B and FIG. 2, an active region is determined by a device isolation structure, such as a Shallow Trench Isolation (STI) 21, which is formed in a silicon substrate 10. The floating gate 23 formed over a tunnel isolation film 22, a dielectric film 24 covering a surface of the floating gate 23, and a control gate 25 formed over the plurality of the floating gates 23 through the dielectric film 24 are formed over the active region, respectively. In the active region, a source/drain region 36 into which impurity is doped is formed at parts on both sides of the floating gates 23.

A memory cell 20 includes the floating gate 23 formed through the tunnel insulation film 22 over the silicon substrate 10, the control gate 25 formed through the dielectric film 24 over the floating gate 23, and the pair of source/drain region 36 in the silicon substrate 10. The dummy cell 20a is provided at an end of the plurality of memory cells 20 and the dummy cell 20a has the same structure as that of the memory cell 20 other than that in which a dummy floating gate 23a is formed instead of the floating gate 23.

Moreover, in the memory cell part 11 and the peripheral part 12, a metal silicide film 26 is formed over the control gate 25 so as to reduce a resistance value of the control gate 25 and an interlayer insulation film 28 is formed such that the above disclosed members are covered with the interlayer insulation film 28.

A connection hole 28a which extends to reach the control gate 25 is formed, through the interlayer insulation film 28. A connection plug 27 is formed so as to fill the connection hole 28a with a conductive material. The control gate 25 is coupled to an interconnection 29 via the connection plug 27.

Note that, as shown in FIG. 2, the dummy floating gate 23a of the dummy cell 20a is formed such that a side surface on an outside, that is, an inclination angle of an end 23b on a side of the peripheral part 12 is made smaller than an inclination angle of a side surface on an inside of the dummy floating gate 23a.

The inclination angle is defined as an angle between a horizontal plane and the sloped side surface of the pattern. Note that the horizontal plane is 0 degree. A preferable inclination angle of the end 23b is from 40 degrees or more to 87 degrees or less if a film thickness of the floating gate 23 and a film thickness of the dummy floating gate 23a are approximately 40 nm to 130 nm and the distance between adjacent floating gates 23 is approximately 70 nm to 240 nm. For example, 55 degrees is preferable.

Hereinafter, a method of manufacturing the flash memory including the above structure will be disclosed.

FIGS. 3 through 11 are schematic diagrams illustrating a process sequence of a manufacturing method of the flash memory according to an embodiment.

FIGS. 3A, 5A, 6A, 7A, 8A, 10A and 11A are plan views. FIGS. 3B, 4, 5B, 6B, 7B, 7C, 8B, 8C, 9A, 9B, 10B, 10C and 10D are sectional views, respectively.

Figure 3A:
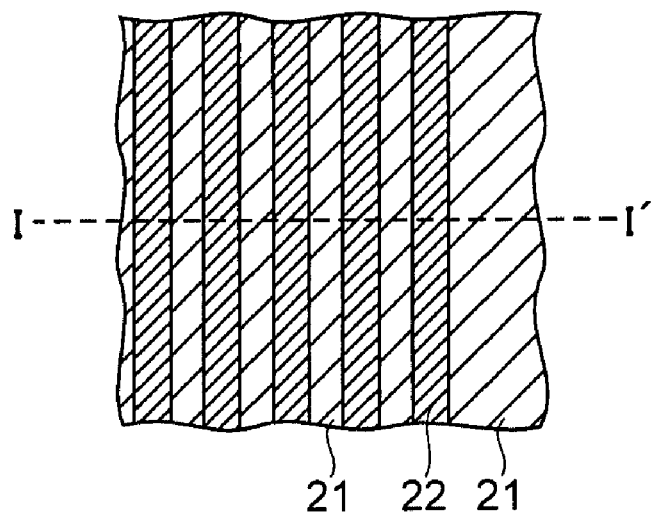
FIGS. 3A and 3B illustrate a method of manufacturing a non-volatile memory according to an embodiment.
Figure 3B:
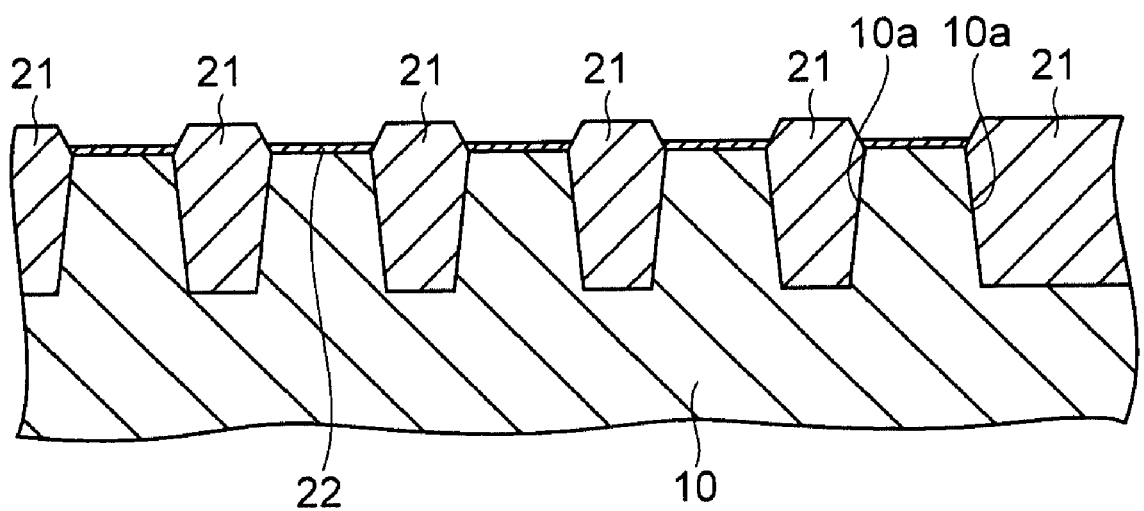

FIG. 3B is a sectional view taken on the line I-I' in FIG. 3A. As shown in FIG. 3B, a separation groove 10a is formed in the silicon substrate 10 and then the insulation film, such as a silicon oxide film, is deposited in the insulation film. Next, the silicon oxide film is planarized with chemical mechanical polishing (CMP) and the STI 21 having the separation groove 10a filled with silicon oxide is formed. The STI 21 determines the active region of the silicon substrate 10.

Thereafter, the tunnel insulation film 22 including the silicon oxide, such as an insulation film having a film thickness of approximately 10 nm, is formed over the active region.

Figure 4:
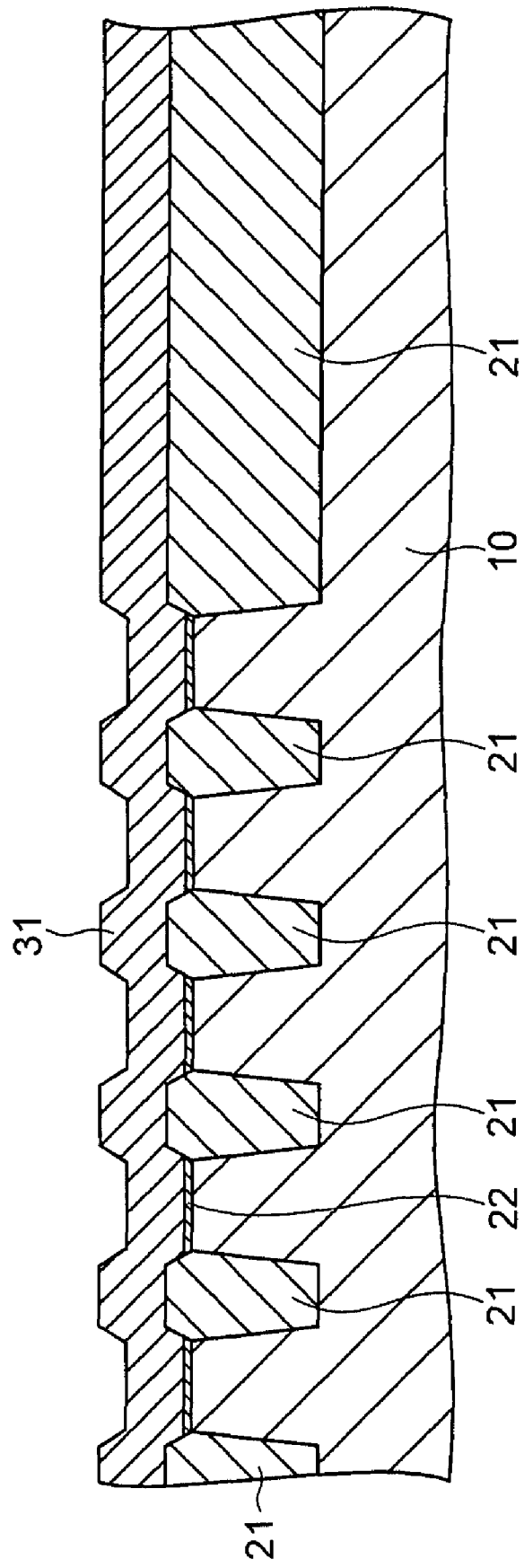
FIG. 4 illustrates a method of manufacturing a non-volatile memory according to an embodiment.

In FIG. 4, a conductive material, such as a polycrystalline silicon film 31 having a film thickness of 40 nm to 150 nm, is deposited over an entire surface of the silicon substrate 10 with, for example, a chemical vapor deposition (CVD). The deposited film thickness is approximately 90 nm.

Figure 5A:
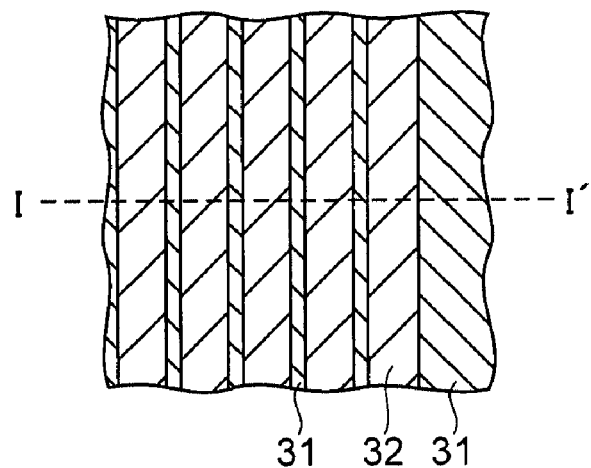
FIGS. 5A and 5B illustrate a method of manufacturing a non-volatile memory according to an embodiment.
Figure 5B:
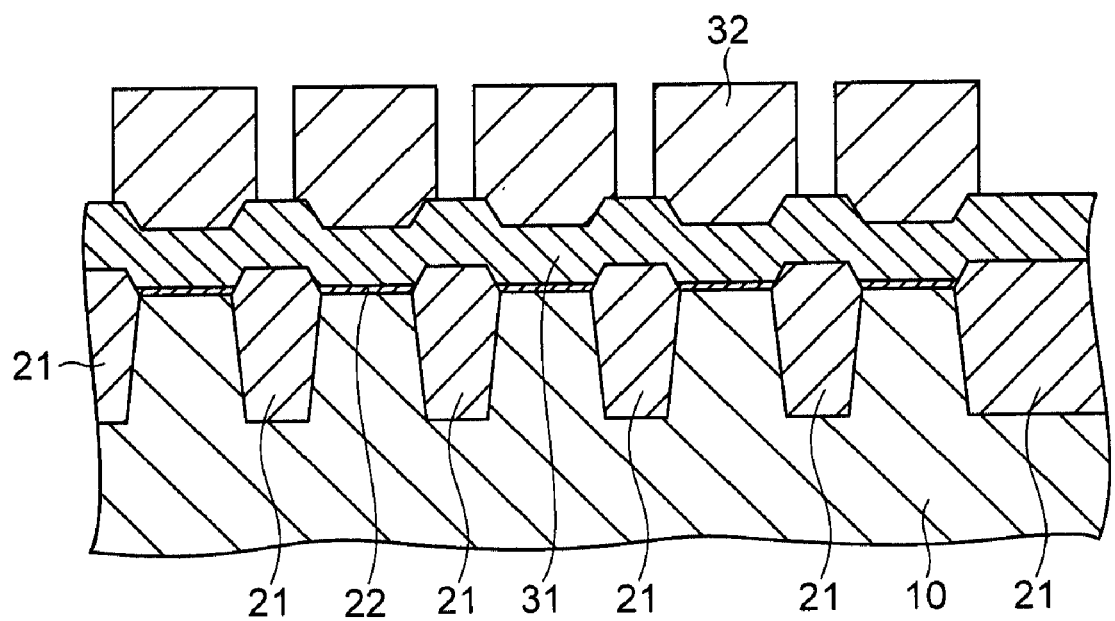

FIG. 5B is a sectional view taken on the line I-I' in FIG. 5A. In FIG. 5B, a resist is applied over the polycrystalline silicon film 31, and a resist mask 32 extending in a direction orthogonal to the line I-I' in FIG. 5A is formed with photolithography.

Figure 6A:
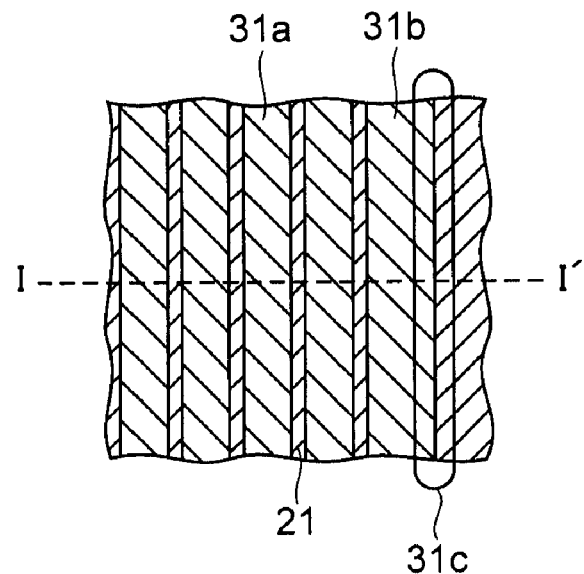
FIGS. 6A and 6B illustrate a method of manufacturing a non-volatile memory according to an embodiment.
Figure 6B:
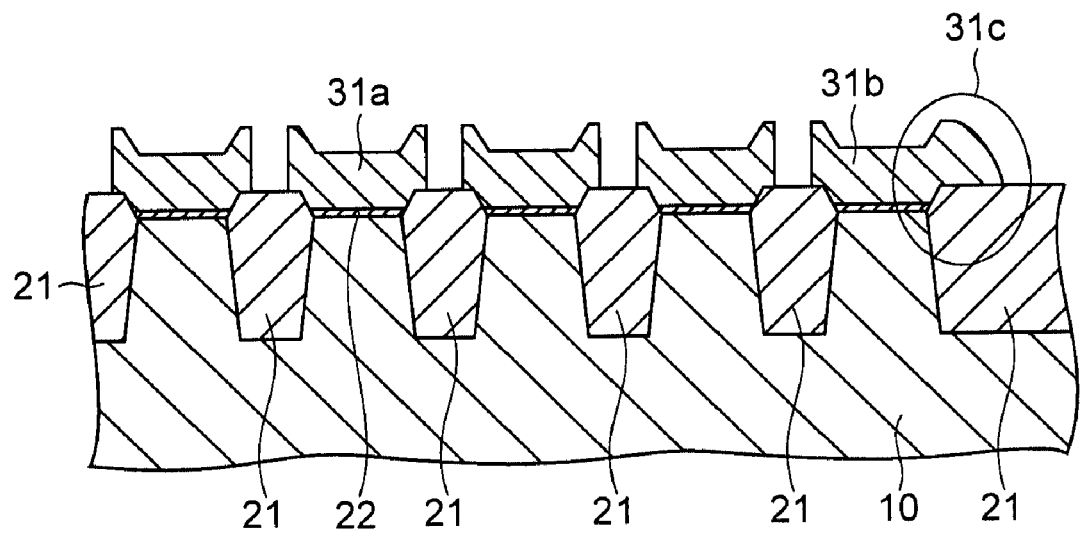

FIG. 6B is a sectional view taken on the line I-I' in FIG. 6A. In FIG. 6B, the polycrystalline silicon film 31a is etched with dry etching in which the resist mask 32 is used, so that the polycrystalline silicon film 31 is divided in the direction orthogonal to the line I-I' in FIG. 6A, and thus a plurality of polycrystalline silicon patterns 31a are formed.

Note that, the dry etching is performed such that an inclination angle of a side surface on an outside (an end 31c) of a polycrystalline silicon pattern 31b provided beside the plurality of polycrystalline silicon patterns 31a is made smaller than an inclination angle of a side surface on an inside of the polycrystalline silicon pattern 31b. The inclination angle of the edge 31c is from 40 degrees or more to 87 degrees or less and, for example, 55 degrees is preferable. On the other hand, it is preferable that the inclination angle of the side surface on the inside of the polycrystalline silicon pattern 31b and inclination angles of both side surfaces of the polycrystalline silicon pattern 31a be an angle which is closer to 90 degrees than the inclination angle of the edge 31c.

In order to vertically form the side surface thereof by etching the polycrystalline silicon film (31) with the dry etching, the dry etching is performed, for example, under a condition in which a pressure is 10 mTorr, a flow rate of hydrogen bromide (HBr) gas is 120 sccm, and a flow rate of chlorine ($Cl_2$) gas is 20 sccm.

In order to make the inclination angle of side surface on the outside of the polycrystalline silicon pattern 31b smaller than the inclination angle of the side surface on the inside thereof, the polycrystalline silicon film 31 is anisotropically dry etched with an etching gas, such as a gaseous mixture including HBr and oxygen ($O_2$) and an oxygen content is from 2% or more to 25% or less or a gaseous mixture including HBr and nitrogen ($N_2$) and a nitrogen content is from 2% or more to 25% or less. If the former gaseous mixture is used, for example, the dry etching is performed in a condition in which a pressure is 9 mTorr, a flow rate of HBr gas is 120 sccm, a flow rate of $Cl_2$ gas is 20 sccm, a flow rate of carbon fluoride ($CF_4$) gas is 20 sccm, and a flow rate of $O_2$ gas is 4 sccm. On the other hand, if the latter gaseous mixture is used, for example, the dry etching is performed in a condition in which a pressure is 9 mTorr, a flow rate of HBr gas is 120 sccm, a flow rate of $Cl_2$ gas is 20 sccm, a flow rate of $CF_4$ gas is 20 sccm, and a flow rate of $N_2$ gas is 6 sccm.

Figure 7A:
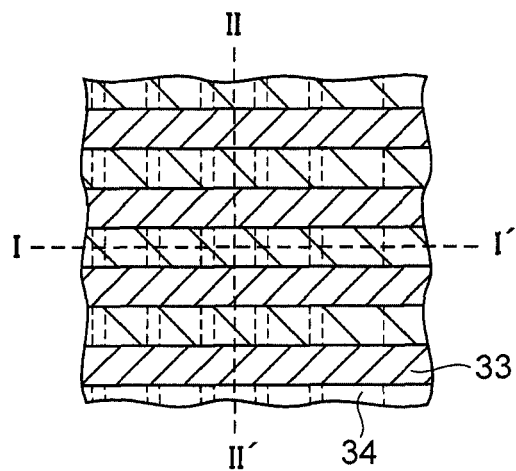
FIGS. 7A to 7C illustrate a method of manufacturing a non-volatile memory according to an embodiment.
Figure 7B:
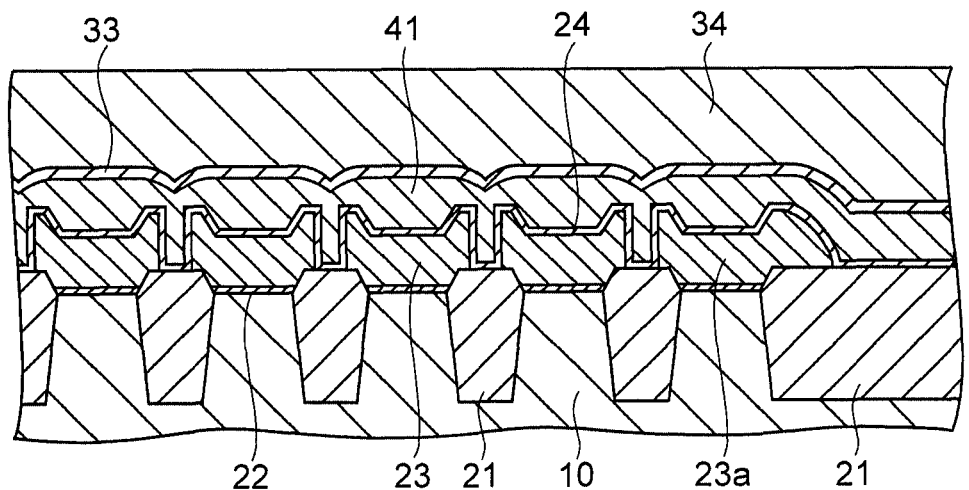
Figure 7C:
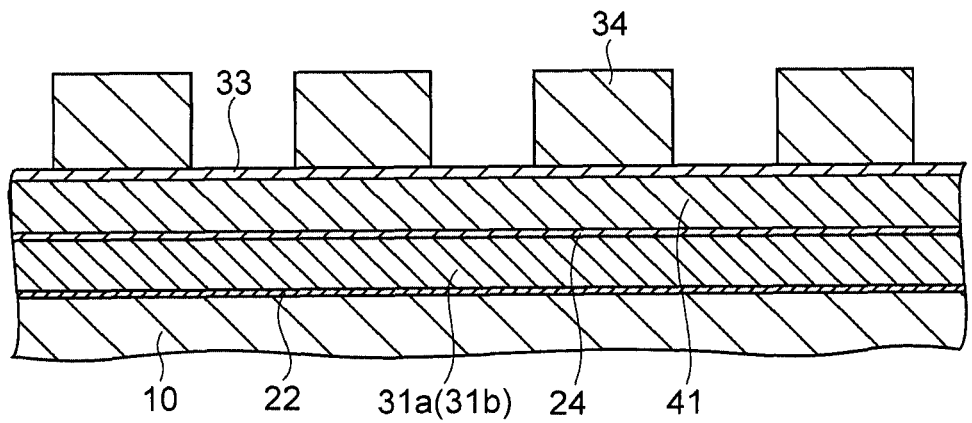

FIG. 7B is a sectional view taken on the line I-I' in FIG. 7A. FIG. 7C is a sectional view taken on a line II-II' in FIG. 7A. As sown in FIGS. 7B and 7C, after the resist mask 32 has been removed with an ashing process or the like, for example, a silicon oxide film, a silicon nitride film, and a silicon oxide film with a total film thickness of 15 nm are formed in order over the entire surface of the silicon substrate 10 and the dielectric film 24 is formed. Then conductive materials, such as a polycrystalline silicon film 41 having a film thickness of approximately 10 nm and a silicon nitride film 33 having a film thickness of 30 nm, are formed in order over the entire surface of the silicon substrate 10 with the CVD or the like.

Thereafter the resist is applied over the silicon nitride film 33, and the resist is processed with the photolithography. As a result, a resist mask 34 extending in a direction parallel to the line I-I' in FIG. 7A is formed.

Figure 8A:
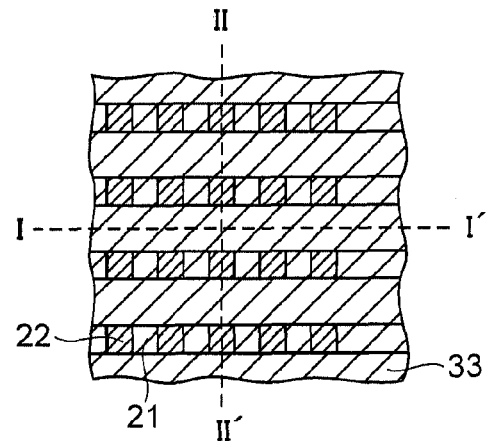
FIGS. 8A to 8C illustrate a method of manufacturing a non-volatile memory according to an embodiment.
Figure 8B:
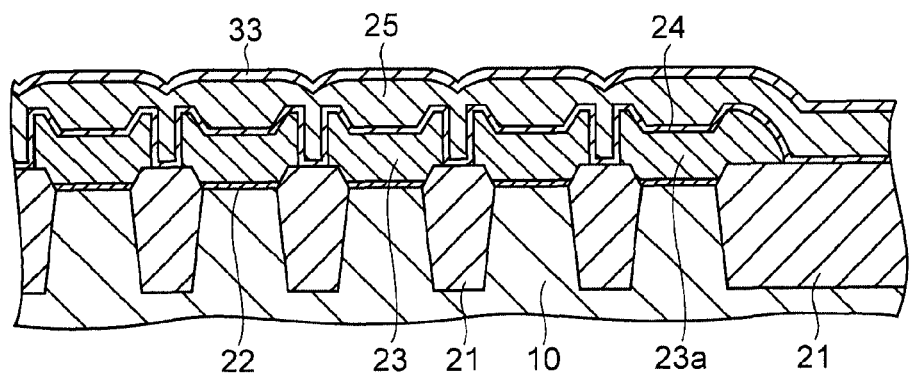
Figure 8C:
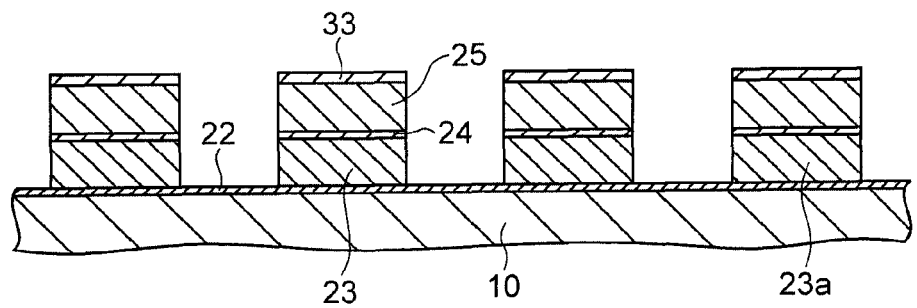

FIG. 8B is a sectional view taken on the line I-I' in FIG. 8A. FIG. 8C is a sectional view taken on the line II-II' in FIG. 8A. In FIGS. 8B and 8C, the polycrystalline silicon film 41, the dielectric film 24, and the polycrystalline silicon patterns 31a and 31b are processed such that the above members are divided in the direction parallel to the line I-I', with the dry etching in which the resist mask 34 is used. With the above process, the polycrystalline silicon pattern 31a is processed into the floating gates 23 each of which is isolated with each other, the polycrystalline silicon pattern 31b is processed into the dummy floating gates 23a each of which is isolated with each other, and the polycrystalline silicon film 41 is processed into the control gates 25, respectively. In this etching process, for example, a gaseous mixture including HBr, $Cl_2$, $O_2$, and $CF_4$ is used. The resist mask 34 is removed with the ashing process or the like.

Figure 9A:
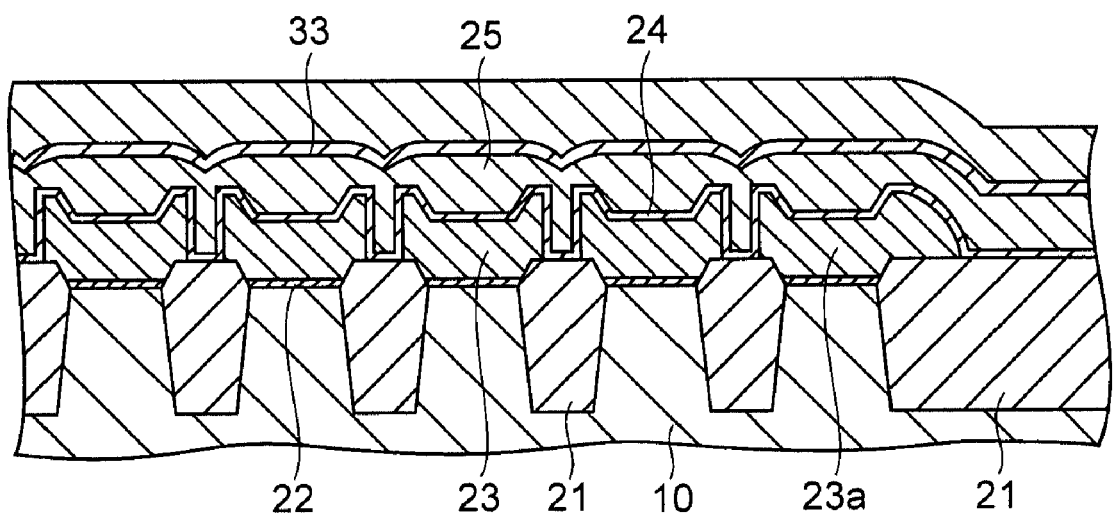
FIGS. 9A and 9B illustrate a method of manufacturing a non-volatile memory according to an embodiment.
Figure 9B:
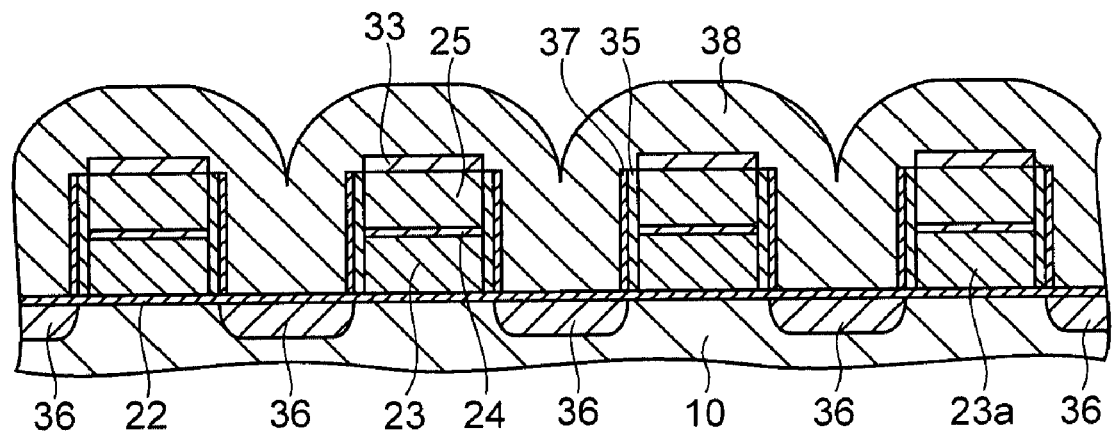

In FIGS. 9A and 9B, first silicon oxide films 35 are formed over both side surfaces of each of the floating gate 23, the dummy floating gate 23a, and the control gate 25, with a thermal oxidation.

Next, ion implantation of an impurity, such as Arsenide (As), into the active region exposed on both sides of the control gate 25 is performed by using the silicon nitride film 33 and the control gate 25 as a mask, and then the ion-implanted impurity is activated by annealing. As a result, the source/drain region 36 is formed. Then a second silicon oxide film 37 is formed with the thermal oxidation.

Thereafter, an insulation film, such as a silicon nitride film 38, is formed over the entire surface of the silicon substrate 10 with the CVD or the like.

Figure 10A:
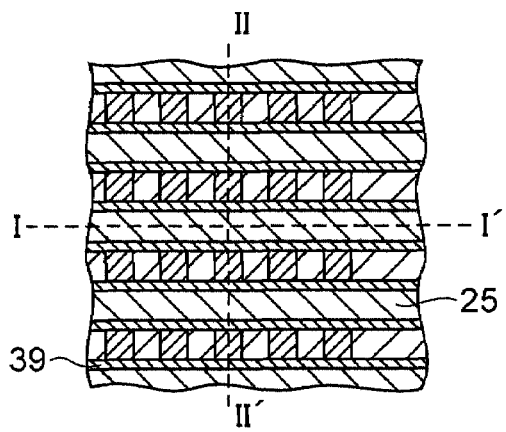
FIGS. 10A to 10D illustrate a method of manufacturing a non-volatile memory according to an embodiment.
Figure 10B:
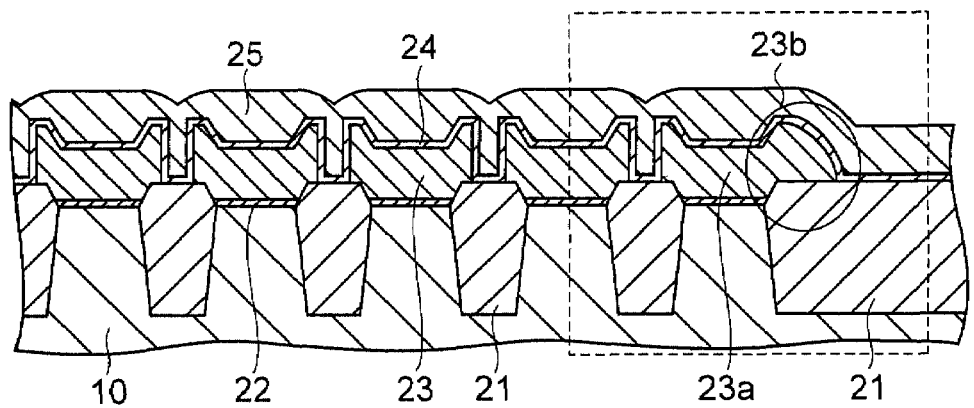
Figure 10C:
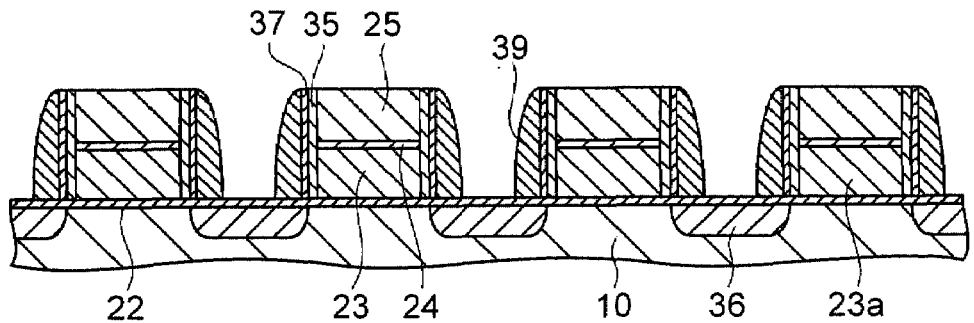

FIG. 10B is a sectional view taken on the line I-I' in FIG. 10A. FIG. 10C is a sectional view taken on the line II-II' in FIG. 10A. In FIGS. 10B and 10C, an entire surface of the silicon nitride film 38 is dry etched. With the dry etching, silicon nitride remains over both side surfaces of each of the floating gate 23, the dummy floating gate 23a, and the control gate 25. As a result, a sidewall insulation film 39 is formed. At this stage of processing, the silicon nitride film 33 of a top surface of the control gate 25 is removed by the dry etching and the top surface of the control gate 25 is exposed.

Figure 10D:
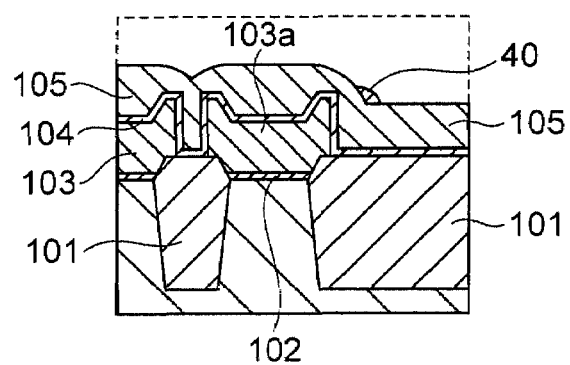

Note that, as shown in FIG. 10D, if both side surfaces of a dummy floating gate 103a are steeply formed like a floating gate 103, a steep slope is formed over a top surface of a control gate 105 and thus a part of the silicon nitride remains as a residual. As a result, a silicon nitride residual 40 is formed.

On the other hand, as shown in FIG. 10B, the smaller the inclination angle of the end 23b of the dummy floating gate 23a is, the gentler the slope of the control gate 25 is. Thus it is possible to effectively reduce the part of the silicon nitride that remains over the control gate 25 as the residual.

Figure 11A:
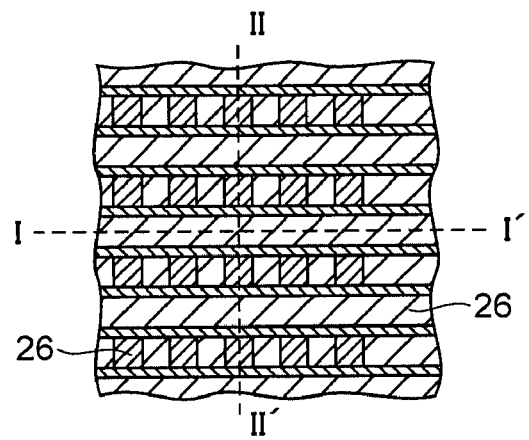
FIGS. 11A to 11D illustrate a method of manufacturing a non-volatile memory according to an embodiment.
Figure 11B:
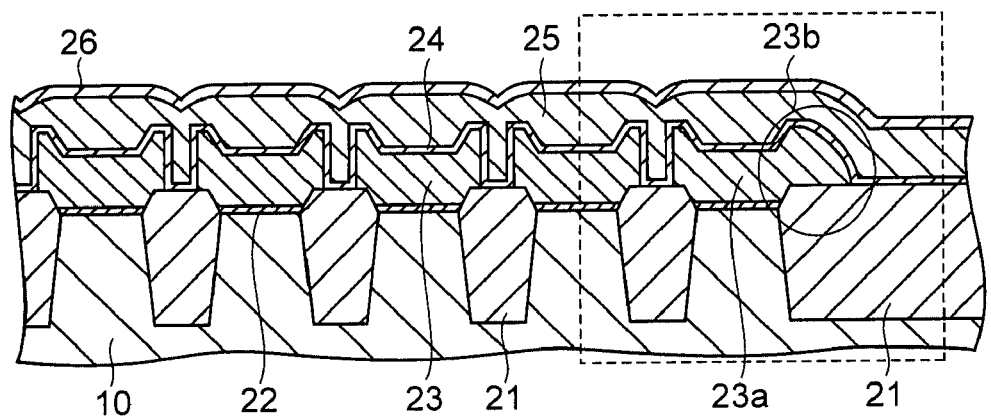
Figure 11C:
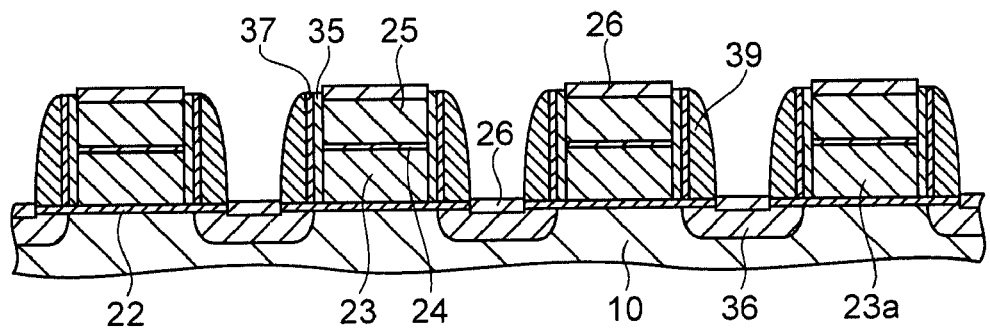
Figure 11D:
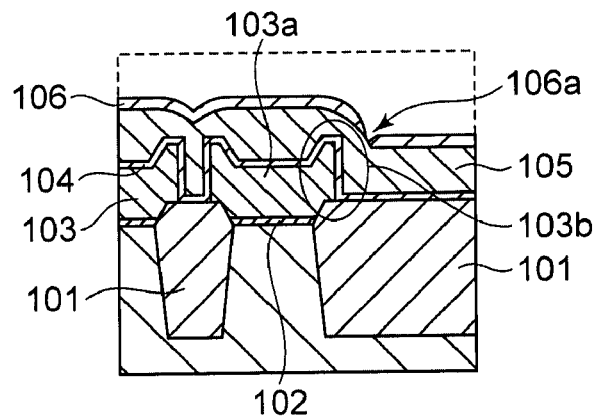

FIG. 11B is a sectional view taken on the line I-I' in FIG. 11A. FIG. 11C is a sectional view taken on the line II-II' in FIG. 11A. In FIGS. 11B and 11C, a metal capable of being silicided, such as a cobalt film, is deposited over the entire surface of the silicon substrate 10 with, for example, sputtering. It is possible to use nickel or a nickel alloy, as the metal capable of being silicided.

Next, a cobalt silicide film is formed by a reaction of silicon and cobalt over the top surface of the control gate 25 and over the source/drain region 36 with the thermal treatment. Then an unreacted cobalt film is removed with wet etching.

With the above process, the metal silicide film 26, such as a cobalt silicide film, is formed over the top surface of the control gate 25 and over the source/drain region 36.

Note that, as shown in FIG. 1D, if both side surfaces of the dummy floating gate 103a are steeply formed like the floating gate 103, this causes an unformed area 106a, on which a metal silicide film 106 is not formed, to be formed at a steep slope part of the control gate 105, due to the shape thereof. On the other hand, as shown in FIG. 11B, by making the inclination angle of the end 23b of the dummy floating gate 23a small, it is possible to effectively reduce an occurrence of an unformed area of the metal silicide film 26 formed over the control gate 25.

In FIG. 2, the insulation film, such as a silicon oxide film having a film thickness of 400 nm, is deposited with the CVD such that the entire surface of the silicon substrate 10 is covered and the interlayer insulation film 28 is formed. Then the connection hole 28a is formed through the interlayer insulation film 28 such that a part of the control gate 25 or a part of the metal silicide film 26 formed thereon is exposed.

Next, the conductive material, such as tungsten, is deposited over the interlayer insulation film 28 such that the connection hole 28a is filled. Then the tungsten is polished until a surface of the interlayer insulation film 28 is exposed, with the CMP. As a result thereof, the connection plug 27 is formed.

Thereafter, the conductive material, such as aluminum or an aluminum alloy, is deposited over the interlayer insulation film 28 including the connection plug 27, the aluminum or the aluminum alloy is processed with the photolithography and the dry etching, and the interconnection 29 electrically coupled to the control gate 25 through the connection plug 27 is formed. Then the interlayer insulation film 28 is further formed over the interconnection 29.

As disclosed above, according to the embodiment, miscellaneous problems caused by the steep slope of the dummy floating gate 23a are solved and the deterioration in semiconductor memory characteristics can be effectively reduced, so that the flash memory with high reliability can be achieved.

What is claimed is:

1. A method of manufacturing a non-volatile semiconductor memory comprising:

forming a first insulating film on a semiconductor substrate;

forming a first conductive film over the first insulating film;

etching the first conductive film by exposing an etchant gas to form a plurality of floating gates and dummy gates arranged in a first direction, wherein the plurality of floating gates are between one of the dummy gates and another one of the dummy gates, wherein a first side surface of an outside of the one of the dummy gates adjacent to an edge of the plurality of the floating gates is exposed to the etchant gas in etching of the first conductive film, and a first interior angle between a bottom surface of the one of the dummy gates and the first side surface of the one of the dummy gates is smaller than a second interior angle between the bottom surface of the one of the dummy gates and a second side surface of an inside of the one of the dummy gates, and wherein a third interior angle between a bottom surface of one of the floating gate and a third side surface of the one of the floating gate and a forth interior angle between the bottom surface of the one of the floating gate and a forth side surface of an inside of the one of the floating gate are closer to 90 degrees than the first interior angle;

forming a second insulation film over the plurality of the floating gates;

forming a second conductive film over the second insulation film; and forming a control gate extended in the first direction by etching the second conductive film;

forming a third insulating film over the control gate;

forming sidewall insulation films on sidewall of the plurality of floating gates and the control gate by etching the third insulating film;

after forming of the sidewall insulation films, forming a metal layer over the control gate, and after forming the metal layer, forming a metal silicide film over the control gate by performing a thermal treatment.

2. The method according to claim 1, wherein the etching of the first conductive film is performed with the etchant gas including hydrogen bromide and oxygen, or including hydrogen bromide and nitrogen.

3. The method according to claim 2, wherein when the etchant gas including hydrogen bromide and oxygen is used, an oxygen content is in a range from 2% to 25%, and when the etchant gas including hydrogen bromide and nitrogen is used, a nitrogen content is in a range from 2% to 25%.

4. The method according to claim 2, wherein the first conductive film includes a polycrystalline silicon film.

5. The method according to claim 4, wherein the first conductive film has a film thickness in a range from 40 nm to 150 nm.

6. The method according to claim 1, wherein the first interior angle is in a range from 40 degrees to 87 degrees.

7. The method according to claim 1, wherein the control gate extends beyond the outside of the floating gate positioned at the end.

* * * * *